(12) United States Patent
Ma

(10) Patent No.: US 9,773,822 B2
(45) Date of Patent: Sep. 26, 2017

(54) ARRAY SUBSTRATE, DISPLAY DEVICE HAVING THE SAME, AND MANUFACTURING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventor: Jun Ma, Beijing (CN)

(73) Assignees: BOE TECHNOLOGY GROUP CO., LTD., Chaoyang District, Beijing (CN); HEFEI XINSHENG OPTOELECTRONICS TECHNOLOGY CO., LTD., Xinzhan General Pilot Zone, Hefei, Anhui (CN)

( * ) Notice: Subject to any disclaimer, the term of this patent is extended or adjusted under 35 U.S.C. 154(b) by 0 days.

(21) Appl. No.: 15/036,939

(22) PCT Filed: Dec. 10, 2015

(86) PCT No.: PCT/CN2015/097048
§ 371 (c)(1),
(2) Date: May 16, 2016

(87) PCT Pub. No.: WO2016/192366
PCT Pub. Date: Dec. 8, 2016

(65) Prior Publication Data
US 2017/0104006 A1    Apr. 13, 2017

(30) Foreign Application Priority Data

May 29, 2015 (CN) .......................... 2015 1 0293345

(51) Int. Cl.
*H01L 27/02* (2006.01)
*H01L 27/12* (2006.01)
*G02F 1/1362* (2006.01)

(52) U.S. Cl.
CPC ...... *H01L 27/124* (2013.01); *G02F 1/136286* (2013.01); *H01L 27/127* (2013.01);
(Continued)

(58) Field of Classification Search
CPC .............. H01L 27/124; H01L 27/1222; G02F 1/136286
See application file for complete search history.

(56) References Cited

U.S. PATENT DOCUMENTS 7,951,628 B2 * 5/2011 Tseng ................ G02F 1/136213
257/83
2006/0223206 A1 10/2006 Kim et al.
2013/0106679 A1 * 5/2013 Chen ................. G02F 1/136286
345/92

FOREIGN PATENT DOCUMENTS

CN     104849930 A     1/2005
CN     102576174 A     7/2012
(Continued)

OTHER PUBLICATIONS

International Search Report & Written Opinion dated Mar. 23, 2016 regarding PCT/CN2015/097048.
(Continued)

*Primary Examiner* — Kimberly Rizkallah
*Assistant Examiner* — Maria Ligai
(74) *Attorney, Agent, or Firm* — Intellectual Valley Law, P.C.

(57) ABSTRACT

The present application discloses an array substrate comprising a first layer comprising a data line; at least one second layer comprising at least one data line overlapping
(Continued)

area on intersections between the first layer and the at least one second layer; and a spacer layer between the first layer and the second layer. The spacer layer comprises a plurality of spacer units spaced apart from each other. Each of the plurality of spacer units is in an area corresponding to the overlapping area.

20 Claims, 5 Drawing Sheets

(52) U.S. Cl.
CPC .............. *H01L 27/1222* (2013.01); *G02F 2001/136295* (2013.01)

(56) References Cited

FOREIGN PATENT DOCUMENTS

| CN | 102629573 A | 8/2012 |
| CN | 104345511 A | 2/2015 |
| JP | 4468326 B2 | 5/2010 |

OTHER PUBLICATIONS

First Office Action in the Chinese Patent Application No. 201510293345.5, dated Apr. 19, 2017; English translation attached.

\* cited by examiner

ARRAY SUBSTRATE, DISPLAY DEVICE HAVING THE SAME, AND MANUFACTURING METHOD THEREOF

CROSS-REFERENCE TO RELATED APPLICATION

This application is a national stage application under 35 U.S.C. §371 of International Application No. PCT/CN2015/097048 filed Dec. 10, 2015, which claims priority to Chinese Patent Application No. 201510293345.5, filed May 29, 2015, the contents of which are incorporated by reference in the entirety.

FIELD

The present invention relates to display technology, more particularly, to an array substrate, a display device having the same, and a manufacturing method thereof.

BACKGROUND

Thin film transistor (TFT) driven display device is the main stream technology in display field. A thin film field effect transistor display device typically includes a color film substrate and a thin film transistor array substrate. The thin film transistor array substrate includes a plurality of pixel units, each of which contains a thin film transistor. When a voltage applied to the gate electrode of the thin film transistor exceeds a threshold voltage value, the channel (i.e., the active layer) is turned on, connecting the source electrode and the drain electrode. The signal in the data line is transmitted from the source electrode to the drain electrode, controlling the pixel electrode connected to the drain electrode. The voltage difference between the pixel electrode and the common electrode drives the liquid crystal molecules, resulting in different rotation angles in the liquid crystal molecules and different light transmission intensity. The display device produces different images on the display panel by this mechanism. Thus, the function of the thin film transistor directly affects the display quality.

SUMMARY

In one aspect, the present invention provides an array substrate comprising a first layer comprising a data line; at least one second layer comprising at least one data line overlapping area on intersections between the first layer and the at least one second layer; and a spacer layer between the first layer and the second layer. The spacer layer comprises a plurality of spacer units spaced apart from each other. Each of the plurality of spacer units is in an area corresponding to the overlapping area.

Optionally, the at least one second layer is selected from one or a combination of a common electrode line, a gate line, and a gate electrode.

Optionally, the spacer layer comprises a first spacer unit overlapping with the data line and the common electrode line.

Optionally, the spacer layer comprises a second spacer unit overlapping with the data line and the gate line.

Optionally, the spacer layer comprises a third spacer unit of a first portion and a second portion integrated; the first portion overlapping with the data line and the gate electrode; and the second portion overlapping with the data line and the gate line.

Optionally, the spacer layer further comprises an active layer.

Optionally, the third spacer unit is integrated with the active layer.

Optionally, the array substrate further comprises an ohmic contact layer on a side of the active layer distal to the at least one first layer; a source electrode and a drain electrode on a side of the ohmic contact layer distal to the at least one first layer; a passivation layer on a side of the source electrode and the drain electrode distal to the at least one first layer; and a pixel electrode on a side of the passivation layer distal to the at least one first layer.

Optionally, the pixel electrode is connected to the drain electrode through a via in the passivation layer.

Optionally, the spacer layer comprises a fourth spacer unit overlapping with the data line and the gate electrode.

Optionally, the spacer layer further comprising an active layer.

Optionally, the fourth spacer unit is integrated with an active layer.

Optionally, the overlapping area has an overlapping width along a width direction of the data line and an overlapping length along a length direction of the data line; each of the plurality of spacer units has a spacer width along a width direction of the data line and a spacer length along a length direction of the data line; and the spacer width is no less than the overlapping width, and the spacer length is no less than the overlapping length.

Optionally, each of the plurality of spacer units is wider than the overlapping area on one side of the overlapping width.

Optionally, each of the plurality of spacer units is wider than the overlapping area on both sides of the overlapping width.

Optionally, each of the plurality of spacer units is longer than the overlapping area on one side of the overlapping length.

Optionally, each of the plurality of spacer units is longer than the overlapping area on both sides of the overlapping length.

Optionally, the spacer layer is a semiconductor layer.

In another aspect, the present invention provides a method of manufacturing an array substrate, comprising: forming a first layer comprising a data line; forming at least one second layer comprising at least one data line overlapping area on intersections between the first layer and the at least one second layer; forming a spacer layer; and forming a plurality of spacer units spaced apart from each other in the spacer layer. Each of the plurality of spacer units is in an area corresponding to the overlapping area.

Optionally, the at least one second layer is selected from one or a combination of a common electrode line, a gate line, and a gate electrode.

Optionally, the step of forming the plurality of space units comprises forming a first spacer unit overlapping with the data line and the common electrode line.

Optionally, the step of forming the plurality of space units comprises forming a second spacer unit overlapping with the data line and the gate line.

Optionally, the spacer layer comprises a third spacer unit of a first portion and a second portion integrated; the first portion overlapping with the data line and the gate electrode; and the second portion overlapping with the data line and the gate line.

Optionally, the spacer layer further comprises an active layer.

Optionally, the third spacer unit is integrated with the active layer.

Optionally, the method further comprises forming an ohmic contact layer on a side of the active layer distal to the at least one first layer; forming a source electrode and a drain electrode on a side of the ohmic contact layer distal to the at least one first layer; forming a passivation layer on a side of the source electrode and the drain electrode distal to the at least one first layer; forming a pixel electrode on a side of the passivation layer distal to the at least one first layer; and forming a via in the passivation layer.

Optionally, the pixel electrode is connected to the drain electrode through the via in the passivation layer.

Optionally, the step of forming the plurality of space units comprises forming a fourth spacer unit overlapping with the data line and the gate electrode.

Optionally, the spacer layer further comprises an active layer.

Optionally, the fourth spacer unit is integrated with an active layer.

Optionally, the overlapping area has an overlapping width along a width direction of the data line and an overlapping length along a length direction of the data line; each of the plurality of spacer units has a spacer width along a width direction of the data line and a spacer length along a length direction of the data line; and the spacer width is no less than, the overlapping width, and the spacer length is no less than, the overlapping length.

Optionally, each of the plurality of spacer units is wider than the overlapping area on one side of the overlapping width.

Optionally, each of the plurality of spacer units is wider than the overlapping area on both sides of the overlapping width.

Optionally, each of the plurality of spacer units is longer than the overlapping area on one side of the overlapping length.

Optionally, each of the plurality of spacer units is longer than the overlapping area on both sides of the overlapping length.

Optionally, the step of forming the plurality of space unit comprises etching the spacer layer.

Optionally, the spacer layer is a semiconductor layer.

In another aspect, the present invention provides a display panel comprising an array substrate described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

In conventional display devices, data lines intersect with gate lines and common electrode lines. In forming the data lines, a mask having a data line pattern is applied on a base substrate, followed by UV exposure. The data line metal reflects light differently from the gate line metal and the common electrode line metal. Due to this difference, the widths of data lines formed around the intersecting parts are smaller than those of the non-intersecting parts. For products having a narrow line-width design, the data lines are prone to open at these intersecting parts.

Figure 1:
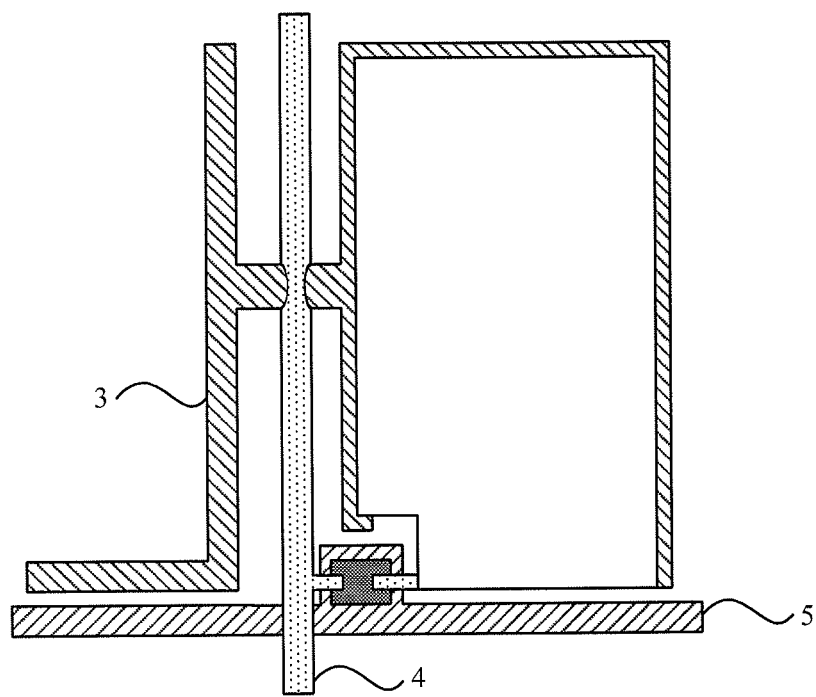
FIG. 1 is a diagram illustrating the structure of a conventional array substrate.

As shown in FIG. 1, the data line 4 and the common electrode line 3 are made of different metal materials. In forming the data line 4, a mask is applied followed by UV exposure. The data line 4 has a narrower line width at the intersecting parts than those of the other parts of the data line 4. A data line so manufactured is prone to open.

Figure 2:
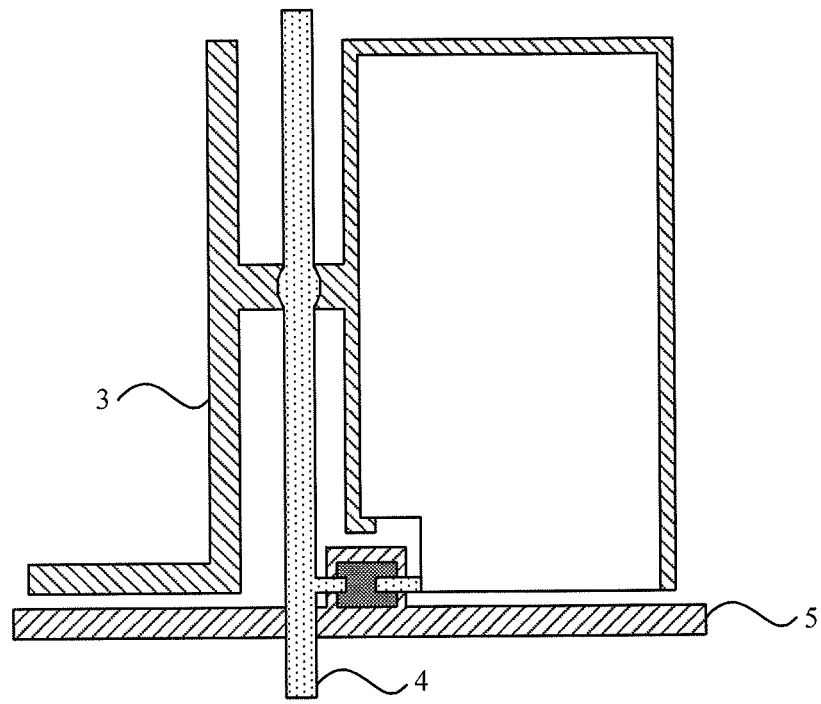
FIG. 2 is a diagram illustrating the structure of another conventional array substrate.

Another conventional design utilizes a mask having a pattern with wider data lines around the intersection parts. As shown in FIG. 2, the width of the data line 4 is larger than the width in other parts of the data line 4. However, this design results in a higher coupling capacitance between the data line and the gate line, or between the data line and the common electrode line. The increased coupling capacitance between the data line 4 and the common electrode line 3 and/or the gate line adversely affects the properties of the array substrate.

The present disclosure in some embodiments provides a superior design that results in data lines having more uniform line widths and much less prone to open. In some embodiments, the present disclosure provides an array substrate having a spacer layer. Specifically, the array substrate includes a first layer, at least one second layer and a spacer layer between the first layer and the at least one second layer. The at least one second layer includes one or more areas that overlap with a data line in the array substrate, i.e., at least one data line overlapping area on intersections between the first layer and the at least one second layer. Examples of at least one second layer include, e.g., a gate line, a gate electrode, and a common electrode line. The first layer includes a data line. In some embodiments, the spacer layer includes a plurality of spacer units spaced apart from each other.

Optionally, the array substrate includes more than one second layers. For example, some data line overlapping areas are in one second layer and some other data line overlapping areas are in another second layer. Optionally, the array substrate includes at least two second layers, e.g., one second layer having the common electrode line and another second layer having the gate line. Optionally, the gate line and the gate electrode are in a same second layer. Optionally, the array substrate includes more than one space layers.

The data line overlaps with one or more second layers in plan view of the array substrate, resulting in at least one data line overlapping area on intersections between the data line and the second layers. The overlapping area has an overlapping width along a width direction of the data line and an overlapping length along a length direction of the data line.

The spacer layer includes a plurality of spacer units in the array substrate, each of which corresponds to an overlapping area. In some embodiments, the spacer layer includes a first spacer unit overlapping with the data line and the common electrode line. In some embodiments, the spacer layer includes a second spacer unit overlapping with the data line and the gate line. In some embodiments, the spacer layer includes a third spacer unit having a first portion and a second portion integrated, the first portion overlapping with the data line and the gate electrode, and the second portion overlapping with the data line and the gate line. In some embodiments, the spacer layer includes a fourth spacer unit overlapping with the data line and the gate electrode. Optionally, the spacer layer further includes an active layer. Optionally, the third spacer unit integrated with the active layer. Optionally, the fourth spacer unit is integrated with an active layer.

The spacer unit has a spacer width along a width direction of the data line and a spacer length along a length direction of the data line. In some embodiments, the area of the spacer unit is no less than the overlapping area. Optionally, the spacer width is no less than the overlapping width. Optionally, the spacer length is no less than the overlapping length. The spacer unit may be wider than the overlapping area on one side of the overlapping width, or on both sides of the overlapping width. Similarly, the spacer unit may be longer than the overlapping area on one side of the overlapping length, or on both sides of the overlapping length. Optionally, the spacer unit is wider than the overlapping area on both side of the overlapping width, and is longer than the overlapping area on both sides of the overlapping length.

Optionally, the spacer width is in the range of 1 to 1.5 times, 1 to 2 times, 1 to 3 times, 1 to 5 times, 1 to 10 times, or 1 to 20 times of the overlapping width. Optionally, the spacer length is in the range of 1 to 1.5 times, 1 to 2 times, 1 to 3 times, 1 to 5 times, 1 to 10 times, or 1 to 20 times of the overlapping length. Optionally, the area of the spacer unit is in the range of 1 to 1.5 times, 1 to 2 times, 1 to 3 times, 1 to 5 times, 1 to 10 times, or 1 to 20 times of the overlapping area.

Figure 3:
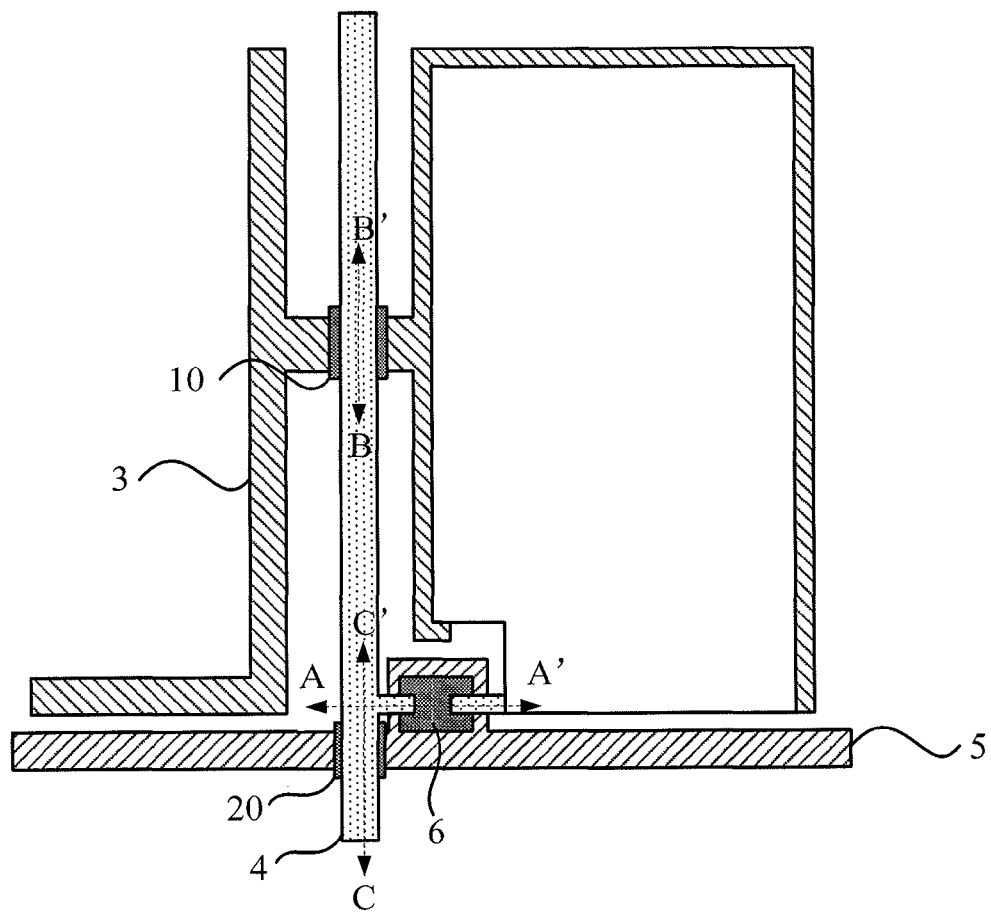
FIG. 3 is a diagram illustrating the structure of an array substrate in some embodiments.

FIG. 3 is a diagram illustrating the structure of an array substrate in some embodiments. Referring to FIG. 3, the array substrate in the embodiment include a substrate 1, a gate line 5, a common electrode line 3 and a data line 4. The data line 4 overlaps with the gate line 5, and overlaps with the common electrode line 3, respectively. In FIG. 3, the array substrate includes a spacer layer between the data line 4 and the common electrode line 3/the gate line 5.

The spacer layer includes a first spacer unit 10 between the data line 4 and the common electrode line 3. As shown in FIG. 3, the data line 4 overlaps with the common electrode line 3 in plan view of the array substrate, resulting in a first overlapping area having a first overlapping width along a width direction of the data line 4 and a first overlapping length along a length direction of the data line 4. The first spacer unit 10 is wider than the data line 4 on at least one side of the data line 4 along the width direction of the data line 4. That is, the spacer width is no less than the first overlapping width. Optionally, the first spacer unit 10 is wider than the data line 4 on both sides of the data line 4 along the width direction of the data line 4. Optionally, the first spacer unit 10 is longer than the first overlapping area on at least one side of the first overlapping length. Optionally, the first spacer unit 10 is longer than the first overlapping area on both sides of the first overlapping length.

In addition, the spacer layer includes a second spacer unit 20 between the data line 4 and the gate line 5. As shown in FIG. 3, the data line overlaps with the gate line 5 in plan view of the array substrate, resulting in a second overlapping area having a second overlapping width along a width direction of the data line 4 and a second overlapping length along a length direction of the data line 4. The second spacer unit 20 is wider than the data line 4 on at least one side of the data line 4 along the width direction of the data line 4. That is, the spacer width is no less than the second overlapping width. Optionally, the second spacer unit 20 is wider than the data line 4 on both sides of the data line 4 along the width direction of the data line 4. Optionally, the second spacer unit 20 is longer than the second overlapping area on at least one side of the second overlapping length. Optionally, the second spacer unit 20 is longer than the second overlapping area on both sides of the second overlapping length. Optionally, the first spacer unit is wider than the first overlapping area on both sides of the first overlapping width, and the first spacer unit is longer than the first overlapping area on both sides of the first overlapping length. Optionally, the second spacer unit is wider than the second overlapping area on both sides of the second overlapping width, and the second spacer unit is longer than the second overlapping area on both sides of the second overlapping length. Optionally, the first spacer unit is wider than the first overlapping area on both sides of the first overlapping width, the first spacer unit is longer than the first overlapping area on both sides of the first overlapping length, the second spacer unit is wider than the second overlapping area on both sides of the second overlapping width, and the second spacer unit is longer than the second overlapping area on both sides of the second overlapping length.

The spacer units space apart the data line 4 and the at least one second layer around the overlapping areas. For example, the first spacer unit 10 spaces apart the data line 4 and the common electrode line 3 by the thickness of the first spacer unit 10. As discussed above, in convention display panels, the data line metal reflects light differently from the common electrode line metal. The width of a data line 4 formed around the first overlapping area in conventional display panels is smaller than that of the non-overlapping area, resulting in a data line width difference. By spacing apart the data line 4 and the common electrode line 3 around the first overlapping area, the distance between the common electrode line 3 and the photoresist layer for patterning the data line 4 is increased. With an increased distance, the effects of light reflection by the common electrode line 3 on the photoresist layer can be reduced. Consequently, the data line width difference around the first overlapping area can be much reduced or eliminated. This generates a much more even data line width throughout the array substrate, the data line 4 is much less prone to open around the first overlapping area.

By having the first spacer unit 10 wider than the first overlapping area on at least one side, optionally both sides, of the data line 4 along the width direction of the data line 4, it can further ensure that the data line 4 is shielded from the underlying common electrode line 3 around one edge, optionally both edges, of the first overlapping area. The effects of the light reflecting difference between the data line 4 and the common electrode line 3 during UV exposure of data line metal can be further alleviated. The data line width difference around the first overlapping area can be further reduced.

By having the first spacer unit 10 longer than the first overlapping area on at least one side, optionally both sides, of the first overlapping area along the length direction of the data line 4, it can further ensure that the data line 4 is shielded from the underlying common electrode line 3 around one side, optionally both sides, of the first overlapping area along the length direction of the data line 4. The effects of the light reflecting difference between the data line 4 and the common electrode line 3 during UV exposure of data line metal can be further alleviated. The data line width difference around the first overlapping area can be further reduced.

The second spacer unit 20 spaces apart the data line 4 and the gate line 5 by the thickness of the second spacer unit 20. As discussed above, in convention display panels, the data line metal reflects light differently from the gate line metal. The width of a data line 4 formed around the second overlapping area in convention display panels is smaller than that of the non-overlapping area, resulting in a data line width difference. By spacing apart the data line 4 and the gate line 5 around the second overlapping area, the distance between the gate line 5 and the photoresist layer for patterning the data line 4 is increased. With an increased distance, the effects of light reflection by the gate line 5 on the photoresist layer can be reduced. Consequently, the data line width difference around the second overlapping area can be much reduced or eliminated. This generates a much more even data line width throughout the array substrate, the data line 4 is much less prone to open around the second overlapping area.

By having the second spacer unit 20 wider than the second overlapping area on at least one side, optionally both sides, of the data line 4 along the width direction of the data line 4, it can further ensure that the data line 4 is shielded from the underlying gate line 5 around one edge, optionally both edges, of the second overlapping area. The effects of the light reflecting difference between the data line 4 and the gate line 5 during UV exposure of data line metal can be further alleviated. The data line width difference around the second overlapping area can be further reduced.

By having the second spacer unit 20 longer than the second overlapping area on at least one side, optionally both sides, of the second overlapping area along the length direction of the data line 4, it can further ensure that the data line 4 is shielded from the underlying gate line 5 around one side, optionally both sides, of the second overlapping area along the length direction of the data line 4. The effects of the light reflecting difference between the data line 4 and the gate line 5 during UV exposure of data line metal can be further alleviated. The data line width difference around the first overlapping area can be further reduced.

Figure 7:
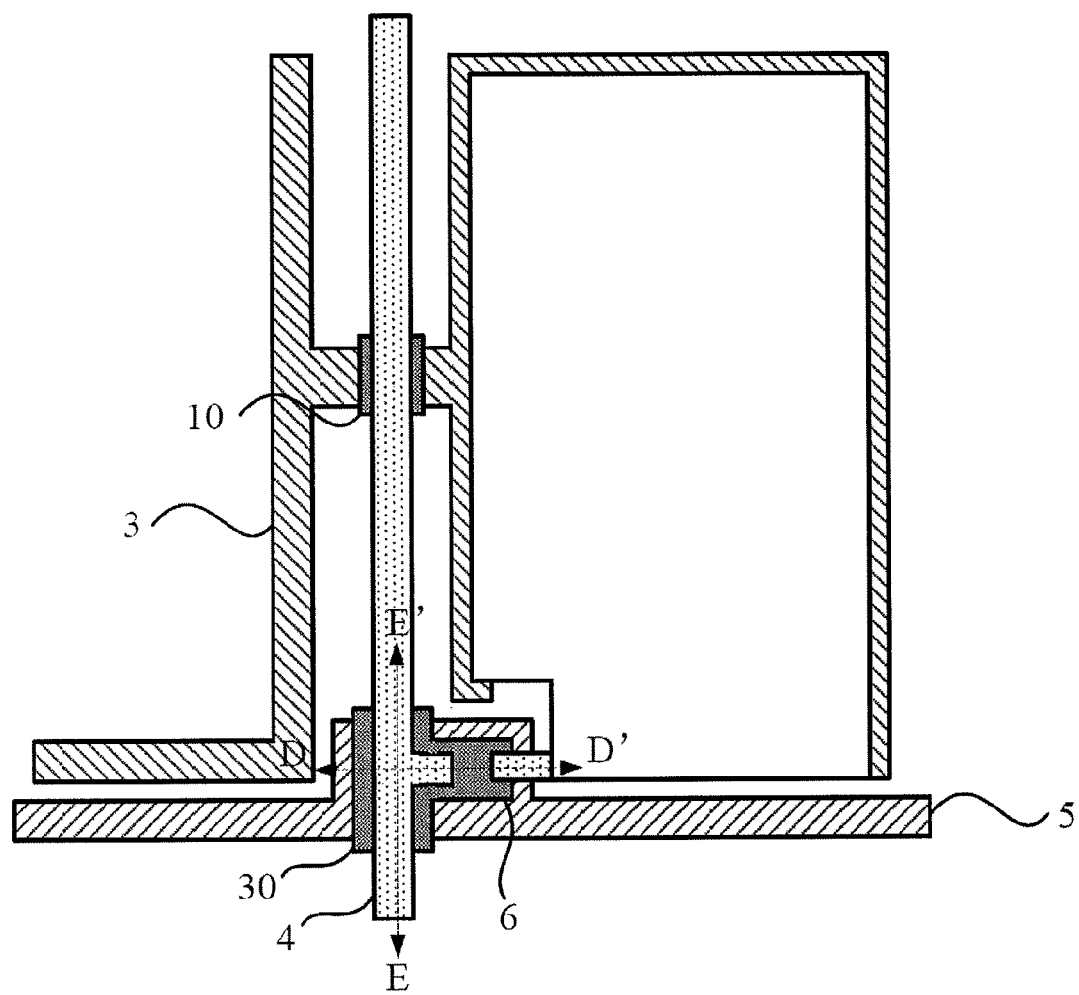
FIG. 7 is a diagram illustrating the structure of an array substrate in some embodiments.

FIG. 7 is a diagram illustrating the structure of an array substrate in some embodiments. Referring to FIG. 7, the array substrate in the embodiment further includes a gate electrode 2. The data line 4 overlaps with the gate electrode 2. In FIG. 7, the array substrate includes a spacer layer between the data line 4 and the gate electrode 2. The spacer layer includes a third spacer unit 30 having a first portion and a second portion integrated. The first portion overlaps with the data line and the gate electrode 2. The second portion overlaps with the data line and the gate line 5. The third spacer unit 30 is between the data line 4 and the gate line 5/the gate electrode 2.

As shown in FIG. 7, the data line 4 overlaps with the gate electrode 2 and the gate line 5 in plan view of the array substrate, resulting in a third overlapping area having a third overlapping width along a width direction of the data line 4 and a third overlapping length along a length direction of the data line 4. The third spacer unit 30 is wider than the data line 4 on at least one side of the data line 4 along the width direction of the data line 4. That is, the spacer width is no less than the third overlapping width. Optionally, the third spacer unit 30 is wider than the data line 4 on both sides of the data line 4 along the width direction of the data line 4. Optionally, the third spacer unit 30 is longer than the third overlapping area on at least one side of the third overlapping length. Optionally, the third spacer unit 30 is longer than the third overlapping area on both sides of the third overlapping length.

Figure 8:
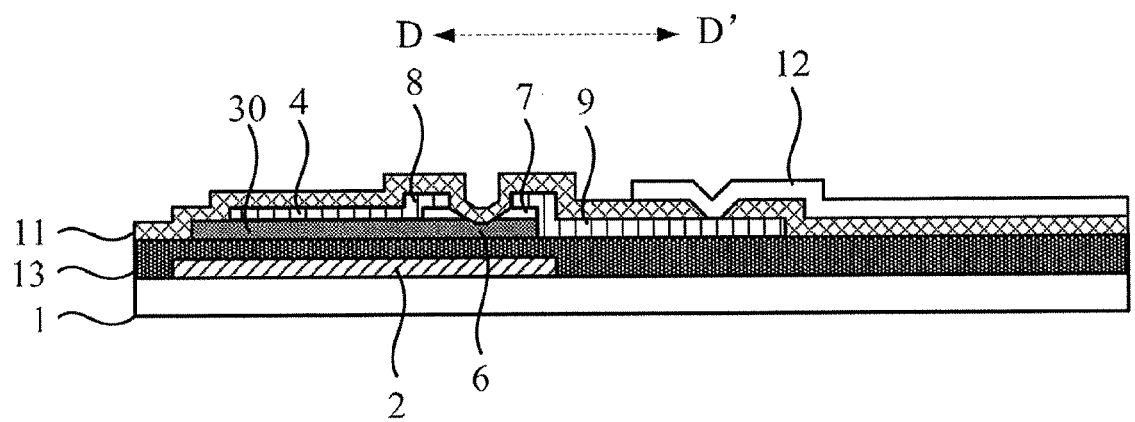
FIG. 8 is a cross-sectional view along the D-D' direction of the array substrate in FIG. 7.
Figure 9:
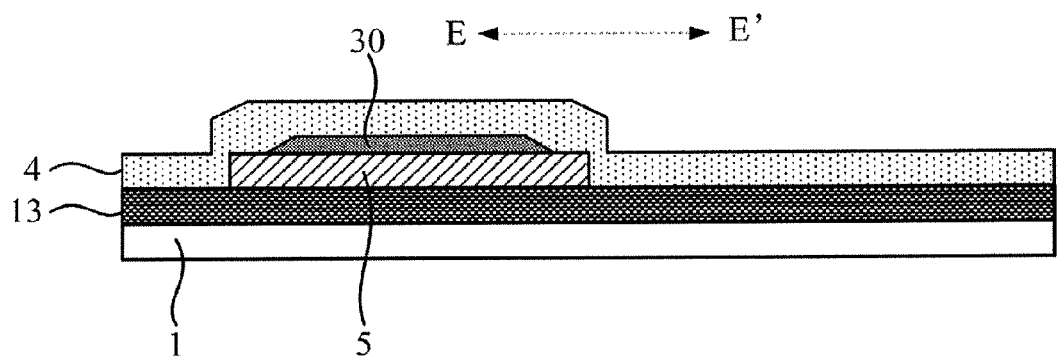
FIG. 9 is a cross-sectional view along the E-E' direction of the array substrate in FIG. 7.

As compared to the array substrate in FIG. 3, the array substrate in FIG. 7 has a larger gate electrode 2, resulting in the third overlapping area. FIG. 8 is a cross-sectional view along the D-D' direction of the array substrate in FIG. 7. As shown in FIG. 8, the gate electrode 2 in FIG. 7 extends from an area corresponding to the active layer 6 to an area corresponding to a neighboring data line 4, resulting in the third overlapping area with the data line 4.

A pixel unit in an array substrate is defined by a plurality of gate line 5 and a plurality of data line 4. The thin film transistor only occupies a relatively small area of the pixel unit.

Figure 4:
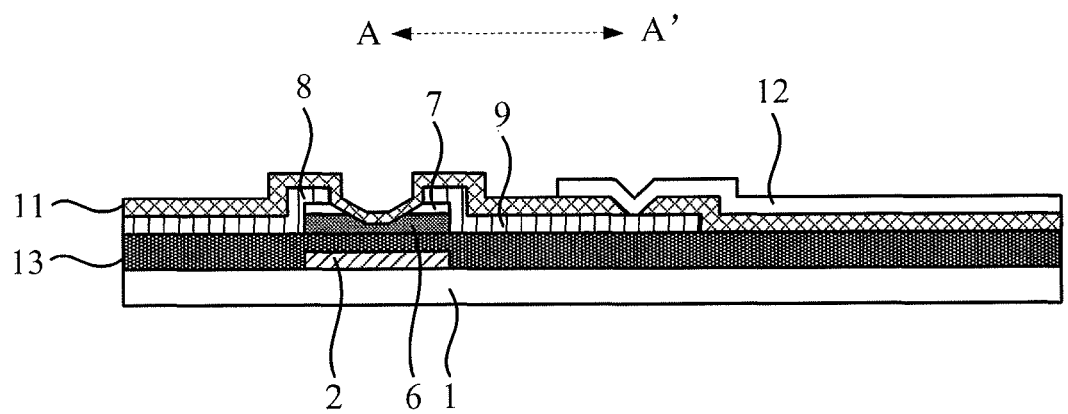
FIG. 4 is a cross-sectional view along the A-A' direction of the array substrate in FIG. 3.
Figure 5:
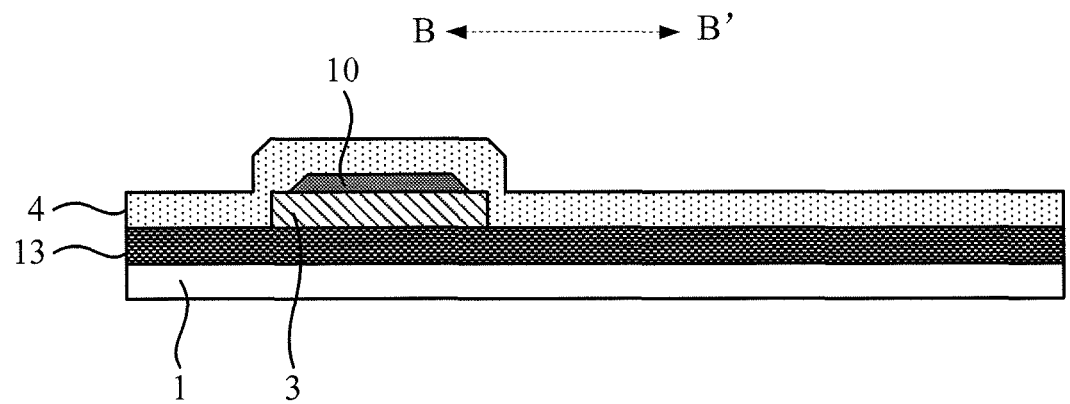
FIG. 5 is a cross-sectional view along the B-B' direction of the array substrate in FIG. 3.
Figure 6:
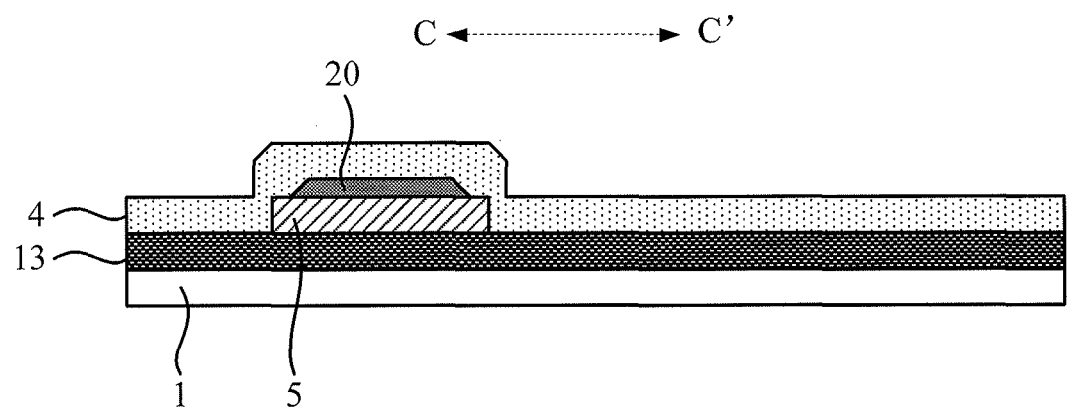
FIG. 6 is a cross-sectional view along the C-C' direction of the array substrate in FIG. 3.

FIG. 4 is a cross-sectional view along the A-A' direction of the array substrate in FIG. 3. As shown in FIG. 4, the data line 4 in the embodiment is only indirectly connected to the thin film transistor. For example, the data line 4 is indirectly connected to the thin film transistor through a source electrode 8, which in turn is connected to the active layer 6 in the thin film transistor. For indirectly connecting the data line 4 to the active layer 6, the interconnecting metal line (the data line 4, the source electrode 8) has to rise to around the same level as the active layer 6. Extending from the data line 4 to the active layer 6, the metal line has to first climb up over a height equivalent to the thickness of the gate insulating layer 13, and goes up to a same level as the gate insulating layer 13. After extending over a distance on the gate insulating layer 13, it then climbs up over a height equivalent to the sum of thicknesses of the active layer 6 and the ohmic contact layer 7, and eventually connects with the ohmic contact layer 7. Due to the steep elevation change over several layers, the metal line is prone to open around this area.

Referring to FIG. 8, the data line 4 in the embodiment overlaps with the gate electrode 2 in plan view of the array substrate. Because the data line 4 overlaps with the gate electrode 2 in plan view of the array substrate, the data line 4 is above the gate insulating layer 13, which is above the gate electrode 2. Thus, the metal line extending from the data line 4 to the source electrode 8 is already above the gate insulating layer 13, on a same level as the active layer 6. The metal line in this design does not have to climb up over a height equivalent to the thickness of the gate insulating layer 13. The elevation change required for connecting the data line 4 and the active layer 6 is less steep. As a result, the metal line is less prone to open around this area.

The third spacer unit 30 spaces apart the data line 4 and the gate line 5/the gate electrode 2 by the thickness of the third spacer unit 30. As discussed above, in convention display panels, the data line metal reflects light differently from the gate electrode metal. The width of a data line 4 formed around the third overlapping area in conventional display panels is smaller than that of the non-overlapping area, resulting in a data line width difference. By spacing apart the data line 4 and the gate line 5/the gate electrode 2 around the third overlapping area, the distance between the gate line 5/the gate electrode 2 and the photoresist layer for patterning the data line 4 is increased. With an increased distance, the effects of light reflection by the gate line 5/the gate electrode 2 on the photoresist layer can be reduced. Consequently, the data line width difference around the third overlapping area can be much reduced or eliminated. This generates a much more even data line width throughout the array substrate, the data line 4 is much less prone to open around the third overlapping area.

By having the third spacer unit 30 wider than the third overlapping area on at least one side, optionally both sides, of the data line 4 along the width direction of the data line 4, it can further ensure that the data line 4 is shielded from the underlying gate electrode 2 around one edge, optionally both edges, of the third overlapping area. The effects of the light reflecting difference between the data line 4 and the gate electrode 2 during UV exposure of data line metal can be further alleviated. The data line width difference around the third overlapping area can be further reduced.

By having the third spacer unit 30 longer than the third overlapping area on at least one side, optionally both sides, of the third overlapping area along the length direction of the data line 4, it can further ensure that the data line 4 is shielded from the underlying gate electrode 2 around one side, optionally both sides, of the third overlapping area along the length direction of the data line 4. The effects of the light reflecting difference between the data line 4 and the gate electrode 2 during UV exposure of data line metal can be further alleviated. The data line width difference around the third overlapping area can be further reduced.

In some embodiments, the array substrate further includes an active layer 6 above the gate electrode 2. Optionally, the active layer 6 is in a same layer as the spacer layer, e.g., the active layer 6 is in a same layer as the third spacer unit 30 (or the fourth spacer unit discussed above). Optionally, the third spacer unit 30 (or the fourth spacer unit) is integrated with the active layer 6. By having the active layer 6 in a same layer as the spacer layer, the manufacturing process can be simplified and the manufacturing costs lowered.

By having the active layer 6 and the spacer layer (e.g., the third spacer unit 30 or the fourth spacer unit) connected, the metal line extending from the data line 4 to the source electrode 8 is above the third spacer layer 30, i.e., above the active layer 6 and at a same level as the ohmic contact layer 7. Accordingly, the metal line does not have to climb up over a height equivalent to the thickness of the active layer 6. The only elevation required for the metal line to climb over is a height equivalent to the thickness of the ohmic contact layer 7. Typically, the ohmic contact layer 7 is a very thin layer above the active layer 6. Thus, the elevation change required for connecting the data line 4 and the active layer 6 is much less steep as compared to that in conventional display panels. As a result, the metal line is less prone to open around this area.

In some embodiments, the array substrate further includes an ohmic contact layer 7 on a side of the active layer 6 distal to the gate electrode 2; a source electrode 8 and a drain electrode 9 on a side of the ohmic contact layer 7 distal to the gate electrode 2; a passivation layer 11 on a side of the source electrode 8 and the drain electrode 9 distal to the gate electrode 2; and a pixel electrode 12 on a side of the passivation layer 11 distal to the gate electrode 2. Optionally, the pixel electrode 12 is connected to the drain electrode 9 through a via in the passivation layer 11.

Figure 10:
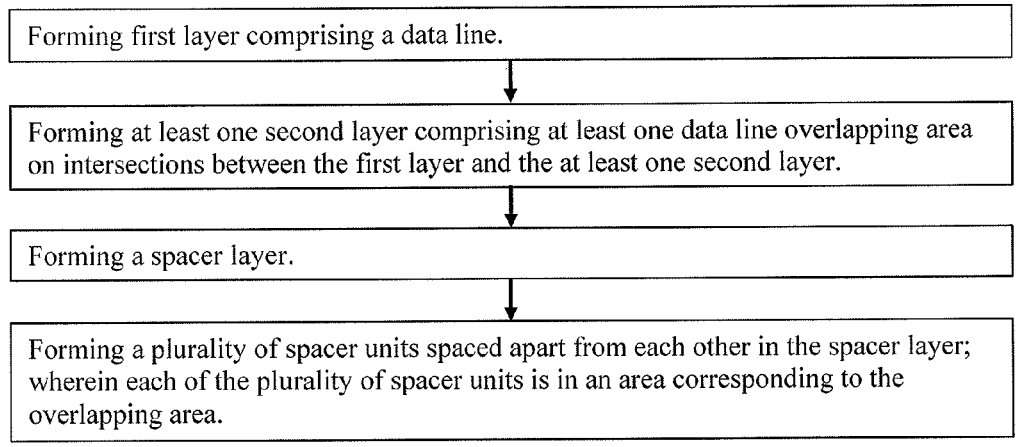
FIG. 10 is a flow chart illustrating a method of manufacturing an array substrate in some embodiments.

FIG. 10 is a flow chart illustrating a method of manufacturing an array substrate in some embodiments. Referring to FIG. 10, the method in the embodiment includes forming a first layer having a data line; forming at least one second layer having at least one data line overlapping area on intersections between the first layer and the at least one second layer; forming a spacer layer; forming a plurality of spacer units spaced apart from each other in the spacer layer; and forming a second layer comprising a data line 4.

In some embodiments, the at least one second layer is selected from one or a combination of a common electrode line 3, a gate line 5, and a gate electrode 2. The data line 4 overlaps with the at least one second layer in plan view of the array substrate, resulting in an overlapping area having an overlapping width along a width direction of the data line 4 and an overlapping length along a length direction of the data line 4. The spacer unit is in an area corresponding to the overlapping area, having a spacer width along a width direction of the data line and a spacer length along a length direction of the data line. Optionally, the spacer width is no less than the overlapping width, and the spacer length is no less than the overlapping length. Optionally, the spacer layer is a semiconductor layer. Optionally, the spacer layer is an insulating layer.

Optionally, the spacer unit is wider than the overlapping area on one side of the overlapping width. Optionally, the spacer unit is wider than the overlapping area on both sides of the overlapping width. Optionally, the spacer unit is longer than the overlapping area on one side of the overlapping length. Optionally, the spacer unit is longer than the overlapping area on both sides of the overlapping length.

The spacer layer includes a plurality of spacer units in the array substrate, each of which corresponds to an overlapping area. In some embodiments, the spacer layer includes a first spacer unit overlapping with the data line 4 and the common electrode line 3. In some embodiments, the spacer layer includes a second spacer unit overlapping with the data line 4 and the gate line 5. In some embodiments, the spacer layer includes a third spacer unit having a first portion and a second portion integrated, the first portion overlapping with the data line and the gate electrode, and the second portion overlapping with the data line and the gate line. In some embodiments, the spacer layer includes a fourth spacer unit overlapping with the data line 4 and the gate electrode 2. Optionally, the spacer layer further includes an active layer. Optionally, the third spacer unit integrated with the active layer. Optionally, the fourth spacer unit is integrated with an active layer.

Optionally, the step of forming the space unit includes forming a first spacer unit overlapping with the data line and the common electrode line. Optionally, the step of forming the space unit includes forming a second spacer unit overlapping with the data line and the gate line. Optionally, the step of forming the space unit includes forming a third spacer unit having a first portion and a second portion integrated; the first portion overlapping with the data line and the gate electrode; and the second portion overlapping with the data line and the gate line. Optionally, the step of forming the space unit includes forming a fourth spacer unit overlapping with the data line and the gate electrode. Optionally, the spacer layer further includes an active layer. Optionally, the third spacer unit integrated with the active layer. Optionally, the fourth spacer unit is integrated with an active layer.

In some embodiments, the method further includes forming a second layer having a gate line 5 and a gate electrode 2.

In some embodiments, the step of forming the first layer includes forming a data line 4 overlapping with the gate line 5/the gate electrode 2 in plan view of the array substrate, resulting in a third overlapping area having a third overlapping width along a width direction of the data line and a third overlapping length along a length direction of the data line.

In some embodiments, the step of forming a spacer unit in the spacer layer includes forming a third spacer unit prior to forming the second layer. The third spacer unit is in an area corresponding to the third overlapping area, having a third spacer width along a width direction of the data line 4 and a third spacer length along a length direction of the data line 4. Optionally, the third spacer width is no less than the third overlapping width. Optionally, the third spacer length is no less than the third overlapping length. Optionally, the step of forming a spacer unit includes etching the spacer layer. Optionally, the spacer layer is a semiconductor layer.

In some embodiments, the method further includes forming an active layer 6 in the spacer layer. Optionally, the active layer 6 is integrated with the third spacer unit.

In some embodiments, the method further includes any one or more of the following steps: forming an ohmic contact layer 7 on a side of the active layer 6 distal to the first layer; forming a source electrode 8 and a drain electrode 9 on a side of the ohmic contact layer 7 distal to the first layer; forming a passivation layer 11 on a side of the source electrode 8 and the drain electrode 9 distal to the first layer; forming a pixel electrode 12 on a side of the passivation layer 11 distal to the first layer; and forming a via in the passivation layer. Optionally, the method includes forming an ohmic contact layer 7 on a side of the active layer 6 distal to the first layer; forming a source electrode 8 and a drain electrode 9 on a side of the ohmic contact layer 7 distal to the first layer; forming a passivation layer 11 on a side of the source electrode 8 and the drain electrode 9 distal to the first layer; forming a pixel electrode 12 on a side of the passivation layer 11 distal to the first layer; and forming a via in the passivation layer. Optionally, the pixel electrode 12 is connected to the drain electrode 9 through the via in the passivation layer 11.

The method described herein may use any appropriate techniques. For example, layers can be formed by vapor deposition or sputtering. The various components may be patterned by, e.g., an etching process.

In convention display panels, the data line metal reflects light differently from the second layer metal. As discussed above, the width of a data line 4 formed around the data line overlapping area in convention display panels is smaller than that of the non-overlapping area, resulting in a data line width difference. By spacing apart the data line 4 and the at least one second layer around the overlapping areas, the distance between the at least one second layer and the photoresist layer for patterning the data line 4 is increased. With an increased distance, the effects of light reflection by the at least one second layer on the photoresist layer can be reduced. Consequently, the data line width difference around the data line overlapping area can be much reduced or eliminated. This generates a much more even data line width throughout the array substrate. Consequently, the data line 4 is much less prone to open around the overlapping areas, even for products having a narrow line-width design.

The present disclosure further provides a display device having the array substrate described herein or manufactured by a method described herein. Examples of display devices include, but are not limited to, an electronic paper, a mobile phone, a tablet computer, a television, a notebook computer, a digital album, a gps, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising:
  a first layer comprising a data line;
  at least one second layer comprising at least one data line overlapping area on intersections between the first layer and the at least one second layer; and
  a spacer layer between the first layer and the second layer;
  wherein the spacer layer comprises a plurality of spacer units spaced apart from each other, each of the plurality of spacer units is in an area corresponding to the overlapping area;
  wherein the spacer layer comprises:
  a third spacer unit of a first portion and a second portion integrated; the first portion overlapping with the data line and the gate electrode resulting in a first overlapping area; and the second portion overlapping with the data line and the gate line;
  the first overlapping area has a first overlapping width along a width direction of the data line and a first overlapping length along a length direction of the data line;
  the first portion has a first spacer width along a width direction of the data line and a first spacer length along a length direction of the data line; and
  the first spacer width is no less than the first overlapping width, and the first spacer length is no less than the first overlapping length.

2. The array substrate of claim 1, wherein the at least one second layer is selected from one or a combination of a common electrode line, a gate line, and a gate electrode.

3. The array substrate of claim 2, wherein the spacer layer comprises a first spacer unit overlapping with the data line and the common electrode line.

4. The array substrate of claim 2, wherein the spacer layer comprises a second spacer unit overlapping with the data line and the gate line.

5. The array substrate of claim 1, wherein the spacer layer further comprises an active layer, and the third spacer unit is integrated with the active layer.

6. The array substrate of claim 5, further comprising:
an ohmic contact layer on a side of the active layer distal to the at least one first layer;
a source electrode and a drain electrode on a side of the ohmic contact layer distal to the at least one first layer;
a passivation layer on a side of the source electrode and the drain electrode distal to the at least one first layer; and
a pixel electrode on a side of the passivation layer distal to the at least one first layer;
wherein the pixel electrode is connected to the drain electrode through a via in the passivation layer.

7. The array substrate of claim 1, wherein the overlapping area has an overlapping width along a width direction of the data line and an overlapping length along a length direction of the data line;
each of the plurality of spacer units has a spacer width along a width direction of the data line and a spacer length along a length direction of the data line; and
the spacer width is no less than the overlapping width, and the spacer length is no less than the overlapping length.

8. The array substrate of claim 7, wherein each of the plurality of spacer units is wider than the overlapping area on both sides of the overlapping width, and is longer than the overlapping area on both sides of the overlapping length.

9. The array substrate of claim 7, wherein each of the plurality of spacer units is wider than the overlapping area on both sides of the overlapping width.

10. The array substrate of claim 7, wherein each of the plurality of spacer units is longer than the overlapping area on one side of the overlapping length.

11. The array substrate of claim 7, wherein each of the plurality of spacer units is longer than the overlapping area on both sides of the overlapping length.

12. The array substrate of claim 1, wherein the spacer layer is a semiconductor layer.

13. A display panel comprising an array substrate of claim 1.

14. A method of manufacturing an array substrate, comprising:
forming a first layer comprising a data line;
forming at least one second layer comprising at least one data line overlapping area on intersections between the first layer and the at least one second layer;
forming a spacer layer; and
wherein forming the spacer layer comprises forming a plurality of spacer units spaced apart from each other in the spacer layer; each of the plurality of spacer units formed in an area corresponding to the overlapping area;
wherein forming the spacer layer comprises forming a third spacer unit of a first portion and a second portion integrated: the first portion formed to be overlapping with the data line and the gate electrode; and the second portion formed to be overlapping with the data line and the gate line;
the first overlapping area has a first overlapping width along a width direction of the data line and a first overlapping length along a length direction of the data line;
the first portion has a first spacer width along a width direction of the data line and a first spacer length along a length direction of the data line; and
the first spacer width is no less than the first overlapping width, and the first spacer length is no less than the first overlapping length.

15. The method of claim 14, wherein the at least one second layer is selected from one or a combination of a common electrode line, a gate line, and a gate electrode.

16. The method of claim 15, wherein forming the plurality of space units comprises forming a first spacer unit overlapping with the data line and the common electrode line.

17. The method of claim 15, wherein forming the plurality of space units comprises forming a second spacer unit overlapping with the data line and the gate line.

18. The method of claim 14, wherein forming the spacer layer comprises forming the third spacer unit integrated with an active layer.

19. The method of claim 14, wherein the overlapping area has an overlapping width along a width direction of the data line and an overlapping length along a length direction of the data line;
each of the plurality of spacer units has a spacer width along a width direction of the data line and a spacer length along a length direction of the data line; and
the spacer width is no less than, the overlapping width, and the spacer length is no less than, the overlapping length.

20. The method of claim 19, wherein each of the plurality of spacer units is wider than the overlapping area on both sides of the overlapping width, and is longer than the overlapping area on both sides of the overlapping length.

* * * * *